United States Patent
Mizuno et al.

(10) Patent No.: US 7,297,423 B2
(45) Date of Patent: Nov. 20, 2007

(54) PRINTED CIRCUIT BOARD

(75) Inventors: Mikihisa Mizuno, Miyagi (JP); Yuichi Sasaki, Miyagi (JP); Makoto Inoue, Miyagi (JP); Kenji Yazawa, Miyagi (JP); Migaku Takahashi, Miyagi (JP); Yasuo Tateno, Miyagi (JP); Teiichi Miyauchi, Kanagawa (JP)

(73) Assignees: Sony Corporation, Tokyo (JP); Migaku Takahashi, Miyagi (JP)

(*) Notice: Subject to any disclaimer, the term of this patent is extended or adjusted under 35 U.S.C. 154(b) by 49 days.

(21) Appl. No.: 11/067,137

(22) Filed: Feb. 25, 2005

(65) Prior Publication Data

US 2005/0238858 A1  Oct. 27, 2005

(30) Foreign Application Priority Data

Mar. 3, 2004  (JP) ............................ P2004-058947
Jan. 14, 2005  (JP) ............................ P2005-007887

(51) Int. Cl.
*B01J 13/12* (2006.01)

(52) U.S. Cl. ............... 428/842.2; 428/329; 428/425.9; 428/842.1; 428/842.4; 428/842.6

(58) Field of Classification Search ............... 428/329, 428/425.9, 689, 694 B, 842.1, 842.2, 842.4, 428/842.6
See application file for complete search history.

(56) References Cited

U.S. PATENT DOCUMENTS

| | | | | |
|---|---|---|---|---|
| 5,695,901 A | * | 12/1997 | Selim | ....................... 430/106.2 |
| 5,773,133 A | * | 6/1998 | Sasaki et al. | ................ 428/216 |
| 5,938,979 A | * | 8/1999 | Kambe et al. | .............. 252/500 |
| 6,410,847 B1 | * | 6/2002 | Allen et al. | .................. 174/390 |
| 6,534,205 B2 | * | 3/2003 | Sato et al. | ................... 428/826 |
| 6,712,997 B2 | * | 3/2004 | Won et al. | ................... 252/503 |

* cited by examiner

*Primary Examiner*—Cathy F. Lam
(74) *Attorney, Agent, or Firm*—Sonnenschein Nath & Rosenthal LLP

(57) ABSTRACT

A PCB that can transmit a high frequency signal of a GHz band with a low loss includes an insulator and magnetic nanoparticles dispersed in the insulator.

15 Claims, 6 Drawing Sheets

PRINTED CIRCUIT BOARD

BACKGROUND OF THE INVENTION

1. Field of the Invention

The present invention relates to a printed circuit board (PCB) for high frequency on which high frequency circuit elements of a GHz band are mounted and more particularly to a PCB capable of transmitting a signal with a low power consumption.

This application claims priority of Japanese Patent Application No. 2004-058947, filed on Mar. 3, 2004 and Japanese Patent Application No. 2005-007887, filed on Jan. 14, 2005, the entireties of which are incorporated by reference herein.

2. Description of the Related Art

In recent years, according to a request for an information process at high speed and an information communication with high density at high speed, the frequency of a signal for operating a high frequency semiconductor element has been remarkably increased. For instance, an LSI chip currently used for a CPU of a computer operates under the clock frequency of several GHz. Further, in a satellite broadcasting a future expansion of which is greatly anticipated or a mobile communication such as a mobile phone, a mobile terminal or the like, a high frequency signal of a GHz band is used.

In a high frequency circuit, a loss is generated in a conductor and a PCB. Especially, the loss in the PCB has been serious. These losses appear as problems such as a heat generation, noise, high consumed electric power when transmitting a signal. That is, the material of the PCB used for elements in a high frequency band is desirably the material which has a property of low loss for the high frequency signal.

When the PCB tracks with characteristic impedance $Z_o$ (Ω) is driven under voltage V (V), a transmission loss P (W) is expressed by a following formula (1). This formula shows that the increase of $Z_o$ is effective for decrease of P under the condition of constant V.

$$P = V^2/Z_o \quad (1)$$

The characteristic impedance $Z_o$ is proportional to a square root of a ratio of the relative magnetic permeability $\mu_r$ of the material of the PCB to the relative dielectric constant $\in_r$ as shown by a following formula (2).

$$Z_o = (L/C)^{1/2} \propto (\mu_r/\in_r)^{1/2} \quad (2)$$

(Here, L represents an inductance per unit length of PCB track and C represents an electric capacity per unit length).

As the PCB with the low loss showing the high characteristic impedance $Z_o$, the PCB using a material of low dielectric constant has been hitherto proposed (for instance, see Japanese Patent Application Laid-Open No. hei 6-53357). In this PCB, the characteristic impedance $Z_o$ can be increased by decreasing the relative dielectric constant $\in_r$ of the PCB, so that the loss can be decreased.

As the material of the low dielectric constant, a fluororesin such as polytetrafluoro ethylene (the relative dielectric constant $\in_r$ is about 2.1). When the porous density of the above-described fluororesin is increased, a lower dielectric constant can be achieved. For instance, in a porous polytetrafluoro ethylene resin having holes as many as 80%, the relative dielectric constant $\in_r$ is about 1.1.

However, the PCB formed with the porous fluororesin is extremely low in its mechanical strength and has low stability for thermal. Accordingly, the above-described PCB has been hardly available for practical use.

Further, since there does not exist the material whose relative dielectric constant $\in_r$ is smaller than 1, there has been a limitation in a method for reducing the loss of the conventional PCB.

SUMMARY OF THE INVENTION

The present invention was devised by taking the above-described problems of the related art into consideration and it is an object of the present invention to provide a PCB that can transmit a high frequency signal of a GHz band can be transmitted with low loss.

The inventors of the present invention newly noticed magnetic characteristics as well as the dielectric characteristics of the PCB. Specifically, they eagerly studied to reduce the loss not only by decreasing the dielectric constant ($\in_r$), but also increasing the magnetic permeability ($\mu_r$) at the same time. Thus, they reached the achievement of the present invention.

The invention proposed to solve the above-described problems relates to a PCB comprising an insulator and magnetic nanoparticles dispersed in the insulator.

Here, the magnetic nanoparticles preferably exhibits superparamagnetism.

The magnetic nanoparticles are preferably superparamagnetic nanoparticles with blocking temperature at 80° C. or lower.

The volume filling rate of the magnetic nanoparticles is not higher than 60%.

The magnetic nanoparticles are preferably made of a material selected from a group including elements Fe, Co, Ni, Mn, Sm, Nd, Th, Al, Pd and Pt, intermetallic compounds of the elements, binary alloys of the elements, ternary alloys of the elements, or the elements, the intermetallic compounds, the binary alloys, the ternary alloys including, as additional elements, at least one of Si, N, Mo, V, W, Ti, B, C and P, Fe oxides, Fe oxides further including at least one of the elements except Fe, Mn—Zn ferrites, Ni—Zn ferrites, Mg—Zn ferrites, Mg—Mn ferrites and garnet.

Further, the magnetic nanoparticles are desirably liquid-phase synthesized.

The insulator is preferably made of a polymer material, ceramic, glass or a composite material of them.

The insulator is preferably made of polytetrafluoro ethylene, tetrafluoro ethylene-hexafluoro ethylene copolymer, tetrafluoro ethylene-hexafluoro propylene copolymer, tetrafluoro ethylene-perfluoroalkyl vinyl ether copolymer, polyvinyl fluoride, polyvinylidene fluoride, polymethyl pentene, polyethylene, polypropylene, polybutadiene, polyamide imide, polyether sulfone, polyether ether ketone, polystyrene, polyester, polycarbonate, polyimide, polyphenylene oxide, an epoxy resin or a cyanate resin.

Further, the insulator is preferably made of alumina ceramic, aluminum nitride ceramic, silicon nitride ceramic, boron nitride ceramic or a composite material of them.

Still further, the insulator is preferably made of silica glass, silicon mica glass, crystal glass, quartz glass, borosilicate glass or a composite material of them.

According to the present invention, the PCB can have a high relative magnetic permeability $\mu_r$ and a low relative dielectric constant $\in_r$ and exhibit a desired low transmission loss even in a GHz band.

DETAILED DESCRIPTION OF THE PREFERRED EMBODIMENTS

Now, an embodiment of a PCB according to the present invention will be described below.

Figure 1:
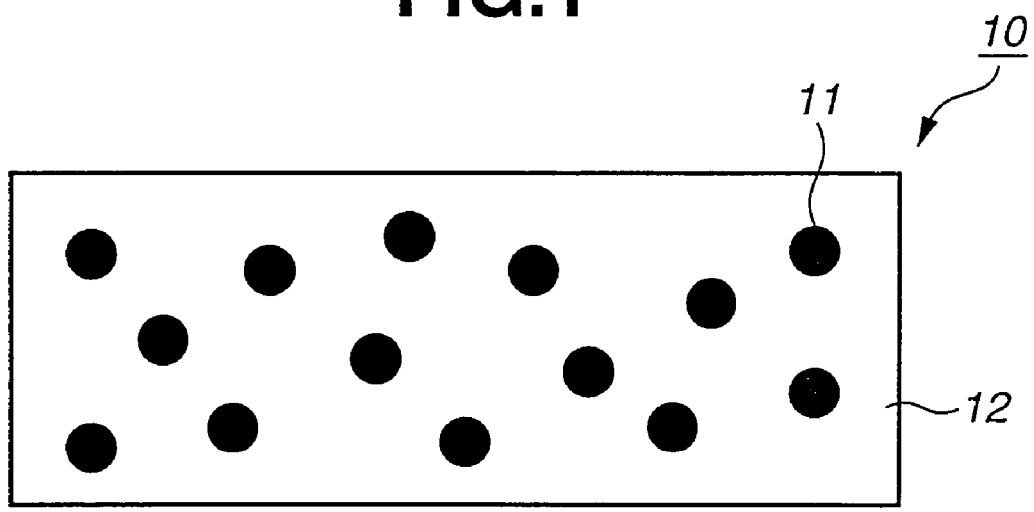
FIG. 1 is a sectional view showing a structure of an embodiment of a PCB according to the present invention.

FIG. 1 shows a sectional view of the PCB according to the present invention.

The PCB 10 includes an insulator 12 and magnetic nanoparticles dispersed in the insulator 12.

The magnetic nanoparticles 11 are fine magnetic particles having the particle size of nano order, have blocking temperature $T_b$ and preferably exhibit superparamagnetism. Especially, the magnetic nanoparticles 11 are preferably superparamagnetic nanoparticles having the blocking temperature $T_b$ at 80° C. or lower. The blocking temperature $T_b$ is set to 80° C. or lower to ensure a high relative magnetic permeability $\mu_r$ within the range of temperature of −10 to 80° C. as using temperature of the PCB.

Now, the blocking temperature $T_b$ will be briefly described below.

In the spontaneous magnetization of the fine magnetic particles, an orientation is maintained by the magnetic anisotropic energy E of the fine particles. Here, the magnetic anisotropic energy E is expressed by the product of the magnetic anisotropic constant K and the volume V of the fine magnetic particles as shown by a following formula. The orientation of the spontaneous magnetization may be possibly changed by heat energy $k_B T$. Here, $k_B$ represents Boltzmann constant and T represents absolute temperature.

$$E = K \cdot V$$

When environmental temperature rises and the heat energy $k_B T$ is substantially the same as the magnetic anisotropic energy E or higher than the magnetic anisotropic energy, the direction of the spontaneous magnetization is continuously thermally activated and vibrated so that residual magnetization disappears. On the other hand, with the fall of temperature, when the heat energy $k_B T$ is adequately lower than the magnetic anisotropic energy E, the vibration in the spontaneous magnetizing direction is suppressed and the residual magnetization begins to appear. The blocking temperature $T_b$ means the temperature at which the residual magnetization begins to appear.

Further, the magnetic nanoparticles 11 are desirably made of a material selected from a group including elements Fe, Co, Ni, Mn, Sm, Nd, Tb, Al, Pd and Pt, intermetallic compounds of the elements, binary alloys of the elements, ternary alloys of the elements, or the elements, the intermetallic compounds, the binary alloys, the ternary alloys including, as additional elements, at least one of Si, N, Mo, V, W, Ti, B, C and P, Fe oxides further including at least one of the elements except Fe, Mn—Zn ferrites, Ni—Zn ferrites, Mg—Zn ferrites, Mg—Mn ferrites and garnet.

As the magnetic nanoparticles 11, there are magnetic nanoparticles that are gas-phase synthesized or liquid-phase synthesized. The magnetic nanoparticles that are liquid-phase synthesized are preferable.

A liquid-phase synthesizing method is a method in which metallic salt or organic metal is dissolved in liquid to separate particles by a reducing process or a decomposing process. As well-known liquid-phase synthesizing methods, a coprecipitation method, a reducing method by alcohol, a thermal decomposition method of organic metal compound, a reversed micelle method, an ultrasonic method and a reducing method by electride may be exemplified. Ordinarily, the magnetic nanoparticles 11 that are liquid-phase synthesized are obtained as dispersion solution in which the surfaces of the magnetic nanoparticles are coated with an organic stabilizer.

Further, according to the liquid-phase synthesizing method, a particle diameter can be controlled by selecting synthesizing conditions. Still further, a particle size distribution can be also controlled by a size selective deposition method after the synthesis. The size selective deposition method is a method that a flocculant is dripped on the dispersion solution of the magnetic nanoparticles to selectively precipitate the particles having large diameter. As the flocculent, a solvent is selected that can be mixed with a solvent of the dispersion solution of the magnetic nanoparticles and has a different solubility of the organic stabilizer.

The magnetic nanoparticles 11 have different values of magnetic anisotropic constants K depending on the kinds of magnetic materials. For instance, in the case of Co, K is expressed by $K=4.5\times10^5$ J/m$^3$. In the case of Fe, K is expressed by $K=4.7\times10^4$ J/m$^3$. In the case of FePt, K is expressed by $K=6.6\times10^6$ J/m$^3$. In the case of $Fe_3O_4$, K is expressed by $K=8.7\times10^3$ μm$^3$.

Accordingly, an optimum particle size is suitably determined depending on the kind of the magnetic material. For instance, the average particle size of Co nanoparticles is preferably 8 nm or smaller. The average particle size of Fe nanoparticles is preferably 25 nm or smaller. The average particle size of FePt nanoparticles is preferably 4 nm or smaller. The average particle size of $Fe_3O_4$ nanoparticles is preferably 30 nm or smaller.

Further, in the magnetic nanoparticles 11 used in the present invention, the standard deviation of the particle size distribution is not higher than 30% as large as the average particle size, preferably not higher than 20% and more preferably not higher than 10%. As the standard deviation becomes smaller, the distribution of the blocking temperature $T_b$ becomes narrower and a higher relative magnetic permeability $\mu_r$ is exhibited. On the other hand, when the standard deviation is higher than 30% as large as the average particle size, since the distribution of the blocking temperature $T_b$ is too wide, the relative magnetic permeability $\mu_r$ is decreased. For instance, within the range of temperature of −10 to 80° C., the relative magnetic permeability $\mu_r$ is smaller than 10.

The insulator 12 is made of a polymer material, ceramic, glass or a composite material of them.

The polymer material includes polytetrafluoro ethylene, tetrafluoro ethylene-hexafluoro ethylene copolymer, tetrafluoro ethylene-hexafluoro propylene copolymer, tetrafluoro ethylene-perfluoroalkyl vinyl ether copolymer, polyvinyl fluoride, polyvinylidene fluoride, polymethyl pentene, polyethylene, polypropylene, polybutadiene, polyamide imide, polyether sulfone, polyether ether ketone, polystyrene, polyester, polycarbonate, polyimide, polyphenylene oxide, an epoxy resin or a cyanate resin.

The ceramic includes the alumina ceramic, the aluminum nitride ceramic, the silicon nitride ceramic and the boron nitride ceramic. Furthermore, the ceramic may be made of a composite material of these ceramics.

The glass includes silica glass, silicon mica glass, crystal glass, quartz glass and borosilicate glass. Furthermore, the glass may be made of a composite material of these glasses.

The volume filling rate of the magnetic nanoparticles 11 dispersed in the insulator 12 is preferably 60% or lower. When the filling rate of the magnetic nanoparticles 11 exceeds 60%, the mechanical strength of the PCB 10 is lowered and the PCB is easily apt to be deformed. Accordingly, the PCB 10 is caused to be distorted during the producing step of the PCB 10. Thus, a positioning operation is difficult when a semiconductor device is produced by using the PCB 10. As a result, the connection to the device is undesirably failed. Further, the volume filling rate of the magnetic nanoparticles 11 dispersed in the insulator 12 is preferably 5% or higher. When the volume filling rate of the magnetic nanoparticles 11 is not lower than 5%, the PCB 10 does not show an adequate relative magnetic permeability $\mu_r$.

In the above-described structure, the PCB 10 has a high relative magnetic permeability $\mu_r$ and a low relative dielectric constant $\in_r$ and can transmit a signal with a low loss in a high frequency area of a GHz band.

Now, a principle that the PCB 10 of the present invention has magnetic characteristics and dielectric characteristics that are compatible with each other will be described below.

(1) With Respect to relative Magnetic Permeability $\mu_r$.

The magnetic nanoparticles 11 contribute to the relative magnetic permeability $\mu_r$ of the PCB 10.

The temperature dependence of the relative magnetic permeability $\mu_r$ of the PCB is expressed by a following formula (3). Here, $\chi_r$ represents a relative magnetic susceptibility of the PCB. $M_s$ represents the saturation magnetization of the magnetic nanoparticles. $V_{ave}$ represents the average volume of the particles. x represents the volume filling rate of particles in the PCB. $K_B$ represents a Boltzmann constant. $\mu_0$ represents a magnetic permeability in a vacuum.

$$\mu_r(T)=\chi_r(T)+1=(M_s^2 V_{ave} x)/(3 K_B T \mu_0)+1 \quad (3)$$

Figure 2:
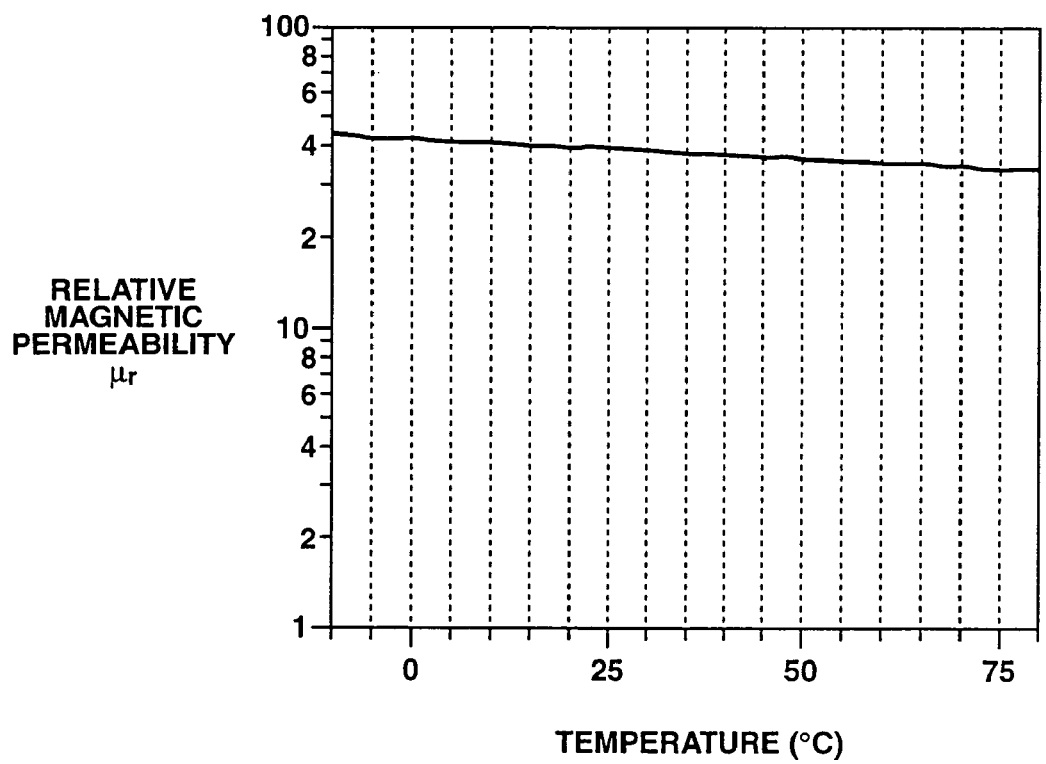
FIG. 2 is a diagram showing a relation between a relative magnetic permeability $\mu_r$ of Co nanoparticles (particle diameter of 7 nm) and temperature T.

FIG. 2 shows the relation between the relative magnetic permeability $\mu_r$ of Co nanoparticles (particle size of 7 nm) and temperature T on the basis of the formula (3). It is apparent from the drawing that the relative magnetic permeability $\mu_r$ is 10 or higher within the range of temperature of −10 to 80° C.

Here, the blocking temperature $T_b$ is proportional to the product of the magnetic anisotropic constant K and the volume V of the magnetic materials as described in a following formula (4). That is, this means that the blocking temperature $T_b$ depends on the kinds of the magnetic materials and the particle size thereof.

$$T_b \propto K \cdot V \quad (4)$$

Suitable kinds of magnetic materials, suitable particle size and a suitable particle size distribution are respectively selected for the magnetic nanoparticles 11 used in the PCB of the present invention. Thus, the blocking temperature $T_b$ can be adjusted. Accordingly, the relative magnetic permeability $\mu_r$ can be controlled to a desired value.

For instance, when the blocking temperature $T_b$ is set to be distributed at 80° C. or lower, the relative magnetic permeability $\mu_r$ in the PCB of the present invention can be set to 10 or higher within the range of temperature of −10 to 80° C.

Now, there is a fear that the relative magnetic permeability $\mu_r$ is lower than 10 due to a hysteresis loss and an eddy current loss in the high frequency area of the GHz band. However, groups of magnetic nanoparticles used in the present invention are distributed in the range where the blocking temperature $T_b$ is located at 80° C. or lower and do not show the hysteresis loss. Further, since the PCB has a structure that the below-described groups of fine particles not larger than skin depth are dispersed in the insulator, the specific resistance of the PCB is sufficiently high and the PCB does not exhibit the eddy current loss.

When a frequency is increased, the fine magnetic particles generate a natural resonance under a certain frequency and the magnetic permeability is abruptly decreased. Therefore, to maintain a satisfactory transmission loss in the PCB of the present invention, the PCB needs to be used in a frequency band except a natural resonance frequency.

Here, a frequency f under which the fine magnetic particles generate the natural resonance is proportional to an anisotropic magnetic field $H_k$ of the fine magnetic particles as described by a following formula.

$$f \propto H_k$$

For instance, in the case of the Co nanoparticles ($H^k=5.1 \times 10^5$ A/m), f is approximately 20 GHz. In the case of the Fe nanoparticles ($H_k=4.4 \times 10^4$ A/m), f is approximately 2 GHz. In the case of the FePt nanoparticles ($H_k=9.2 \times 10^6$ A/m), f is approximately 300 GHz. In the case of the $Fe_3O_4$ nanoparticles ($H_k=2.7 \times 10^4$ A/m), f is approximately 1 GHz.

From the above-described facts, the magnetic nanoparticles have a high relative magnetic permeability $\mu_r$.

(2) With Respect to Relative Dielectric Constant $\in_r$.

Both the insulator 12 and the magnetic nanoparticles 11 contribute to the relative dielectric constant $\in_r$ of the PCB 10.

For the insulator 12, the material showing the low relative dielectric constant $\in_r$ and the low dielectric loss is employed as described above. For instance, polytetrafluoro ethylene has the relative dielectric constant $\in_r$ of 2.1 and dielectric loss tangent of $1 \times 10^{-4}$ (measurement under 1 MHz).

The dielectric characteristics when the insulator 12 is filled with the magnetic nanoparticles 11 are different from those when the insulator 12 is not filled with the magnetic nanoparticles 11. However, when the volume filling rate of the magnetic nanoparticles 11 is not higher than 60%, the dielectric characteristics, necessary for the PCB 10, for instance, the relative dielectric constant $\in_r$ can be maintained to 5 or smaller.

As described above, the PCB of the present invention can have not only the high relative magnetic permeability $\mu_r$, but also the low relative dielectric constant $\in_r$ and can exhibit the satisfactory low transmission loss even in the GHz band.

Now, a method for producing the PCB according to the present invention will be described below.

The PCB according to the present invention may be preferably produced in accordance with a below-described procedure.

(s11) The magnetic nanoparticles are dispersed in a solvent.
(s12) The material of the insulator is mixed in the dispersion solution.
(s13) While the solution is agitated, the solvent is evaporated to obtain a black residual solid material.
(s14) The residual solid material is compression-molded to obtain the PCB.

The liquid-phase synthesized magnetic nanoparticles are obtained as the dispersion solution in which the surfaces of the magnetic nanoparticles are coated with the organic stabilizer. Accordingly, the step s11 may be omitted and the dispersion solution can be directly used as the dispersion solution in the step s12.

Further, the insulator used herein may be made of any of the polymer material, the ceramic, the glass or the composite material of them. A process of mixing the material of the insulator in the dispersion solution in the step s12 may be carried out by a method for dissolving the polymer material in a solvent.

The PCB according to the present invention may be produced by another procedure as described below.
(s21) The surfaces of the magnetic nanoparticles are coated with an insulator material component and the obtained magnetic nanoparticles are dispersed in a solvent.
(s22) While the solution is agitated, the solvent is evaporated to obtain a black residual solid material.
(s23) The residual solid material is compression-molded, and heated and sintered to obtain the PCB.

The material of the insulator used herein is preferably made of the ceramic or the glass. A process for coating the surfaces of the magnetic nanoparticles with the insulator material component in the step s21 may be carried out by a sol-gel method.

In accordance with any of the above-described producing methods, the PCB having the structure shown in FIG. 1 can be obtained.

The PCB of the present invention can be used as a strip line, a microstrip line or a board for other circuits.

EXAMPLES

Now, the present invention will be described below in more detail by way of Examples. The present invention is not limited to the Examples.

Example 1

Using materials, a method for forming the PCB and a method for forming a transmitting line in the Example 1 will be described below.

(1) Using Materials
(i) Magnetic nanoparticles: Toluene dispersion solution of oleic acid coated $Fe_3O_4$ magnetic nanoparticles synthesized by the alcohol reducing method was used. The average particle size of the $Fe_3O_4$ magnetic nanoparticles was 16 nm. The standard deviation of the particle size distribution was 19% as large as the average particle size.
(ii) Insulator material: Powdered polytetrafluoro ethylene (average particle size: 25 μm) was used.

(2) Method for Forming PCB
The powdered polytetrafluoro ethylene was mixed in the toluene dispersion solution of the $Fe_3O_4$ magnetic nanoparticles. Here, the volume ratio of the $Fe_3O_4$ magnetic nanoparticles to polytetrafluoro ethylene was set to 30:70.

Then, the solution was maintained at 60° C. and agitated by using a homogenizer to evaporate toluene and obtain a black residual solid material.

Then, the black residual solid material was compression-molded to manufacture the PCB.

Figure 3:
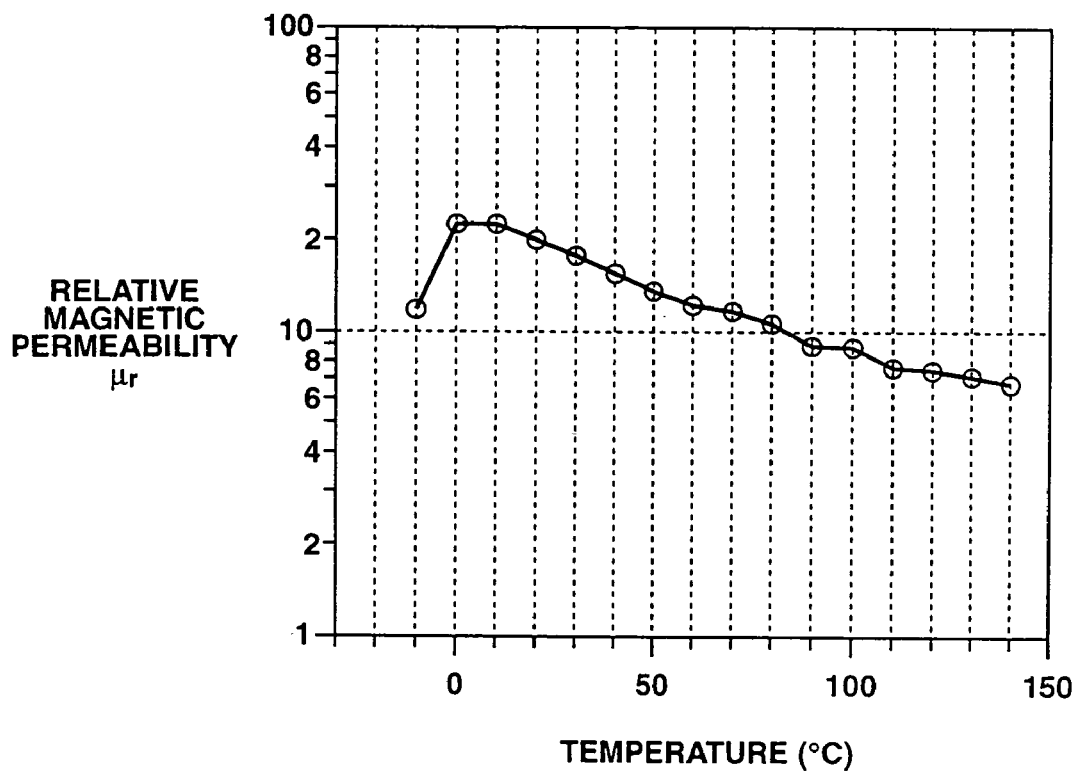
FIG. 3 is a diagram showing the temperature dependence of the relative magnetic permeability $\mu_r$ of a PCB of Example 1.

In the manufactured PCB, the relative magnetic permeability $\mu_r$ was measured. The results thereof are shown in FIG. 3.

When the blocking temperature $T_b$ was located in the vicinity of 5° C. and the temperature was located within a range of −10 to 80° C., the relative magnetic permeability $\mu_r$ exhibited 10 or higher. Further, the relative dielectric constant $\in_r$ exhibited a value not larger than 5.

On the other hand, in the PCB manufactured only by using the powdered polytetrafluoro ethylene as a comparative example, the relative magnetic permeability $\mu_r$ was 1 and the relative dielectric constant $\in_r$ was 2.1.

Figure 4A:
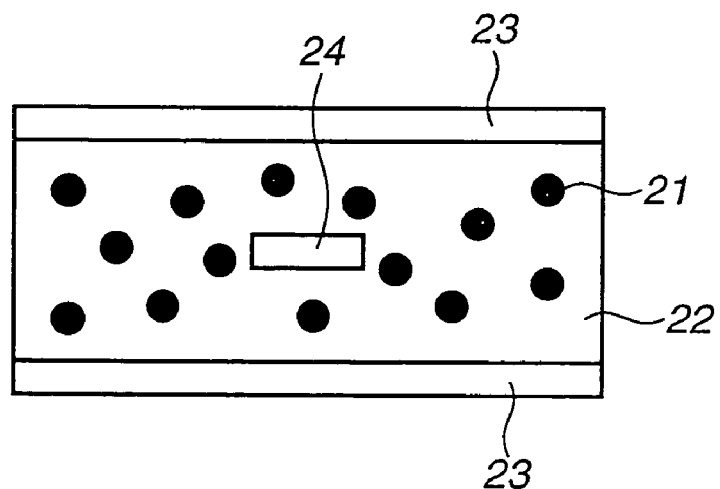
FIG. 4 is a sectional view of the PCB of the present invention in which a transmitting line formed.

(3) Method for Forming Transmitting Line
Then, the conductor was embedded in the PCB including the $Fe_3O_4$ magnetic nanoparticles 21 and insulator 22 that were obtained as described above. The conductors 23 were vapor deposited on an upper surface and a lower surface to form a strip line (see FIG. 4A). When the characteristic impedance $Z_o$ of a transmitting line 24 was evaluated, the characteristic impedance $Z_o$ had a value two times or more as high as the characteristic impedance $Z_o$ in the PCB of the comparative example within a range of temperature of −10 to 80° C. Accordingly, it was recognized from the formula (1) that the PCB of the Example 1 could transmit a signal with a lower loss.

The relative magnetic permeability $\mu_r$ of the PCB of the Example 1 had a dependence on temperature and exhibited different values depending on temperature as shown in FIG. 3.

To suppress the temperature dependence of the relative magnetic permeability $\mu_r$, a plurality of $Fe_3O_4$ magnetic nanoparticles having different particle sizes and different particle size distributions may be mixed together at the suitable ratio. The board using the mixture of the magnetic particles as the magnetic nanoparticles can suppress the change of the relative magnetic permeability $\mu_r$ due to temperature within an arbitrary range of temperature.

Example 2

Using materials, a method for forming the PCB and a method for forming a transmitting line in the Example 2 will be described below.

(1) Using Materials
(i) Magnetic nanoparticles: Toluene dispersion solution of oleic acid coated Mn—Zn ferrite nanoparticles synthesized by the alcohol reducing method was used. The average particle size of the Mn—Zn ferrite nanoparticles was 10 nm. The standard deviation of the particle size distribution was 29% as large as the average particle size.
(ii) Insulator material: Powdered polytetrafluoro ethylene (average particle size: 25 μm) was used.

(2) Method for Forming PCB
The powdered polytetrafluoro ethylene was mixed in the toluene dispersion solution of the Mn—Zn ferrite nanoparticles. Here, the volume ratio of the Mn—Zn ferrite nanoparticles to polytetrafluoro ethylene was set to 40:60.

Then, the solution was maintained at 60° C. and agitated by using a homogenizer to evaporate toluene and obtain a black residual solid material.

Then, the black residual solid material was compression-molded to manufacture the PCB.

Figure 5:
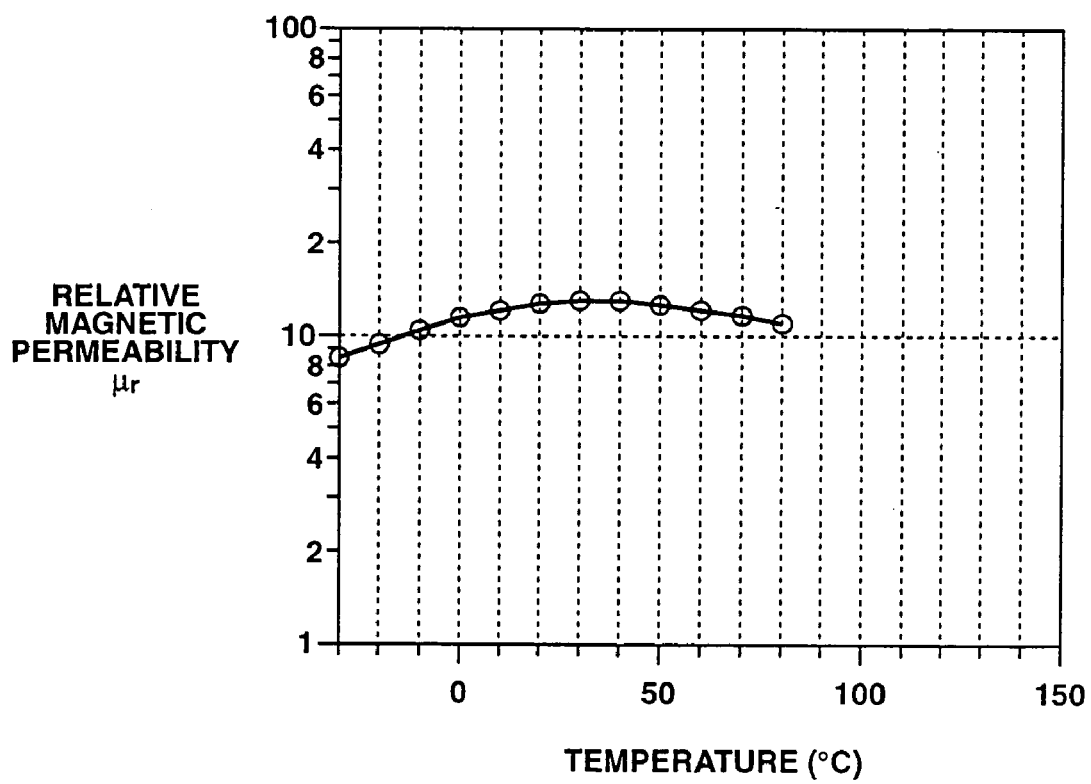
FIG. 5 is a diagram showing the temperature dependence of the relative magnetic permeability $\mu_r$ of a PCB of Example 2.

In the manufactured PCB, the relative magnetic permeability $\mu_r$ was measured. The results thereof are shown in FIG. 5.

When the blocking temperature $T_b$ was located in the vicinity of 30° C. and the temperature was located within a range of −10 to 80° C., the relative magnetic permeability $\mu_r$ exhibited 10 or higher. Further, the relative dielectric constant $\in_r$ exhibited a value not larger than 5.

(3) Method for Forming Transmitting Line

Then, a microstrip line 33 was formed by a vapor deposition method in the PCB including the Mn—Zn ferrite nanoparticles 31 and insulator 32 that were obtained as described above (see FIG. 4B). When the characteristic impedance $Z_o$ of a transmitting line 34 was evaluated, the characteristic impedance $Z_o$ of the transmitting line 34 had a value two times or more as high as the characteristic impedance $Z_o$ in the PCB of the comparative example described above within a range of temperature of −10 to 80° C. Accordingly, it was recognized from the formula (1) that the PCB of the Example 2 could transmit a signal with a lower loss.

Example 3

Using materials, a method for forming the PCB and a method for forming a transmitting line in the Example 3 will be described below.

(1) Using Materials
(i) Magnetic nanoparticles: Toluene dispersion solution of oleic acid coated $Fe_{50}CO_{50}$ nanoparticles synthesized by the thermal decomposition method was used. The average particle size of the $Fe_{50}CO_{50}$ nanoparticles was 12 nm. The standard deviation of the particle size distribution was 17% as large as the average particle size.
(ii) Insulator material: Powdered polytetrafluoro ethylene (average particle size: 25 μm) was used.

(2) Method for Forming PCB

The powdered polytetrafluoro ethylene was mixed in the toluene dispersion solution of the $Fe_{50}CO_{50}$ nanoparticles. Here, the volume ratio of the $Fe_{50}CO_{50}$ nanoparticles to polytetrafluoro ethylene was set to 20:80.

Then, the solution was maintained at 60° C. and agitated by using a homogenizer to evaporate toluene and obtain a black residual solid material.

Then, the black residual solid material was compression-molded to manufacture the PCB.

Figure 6:
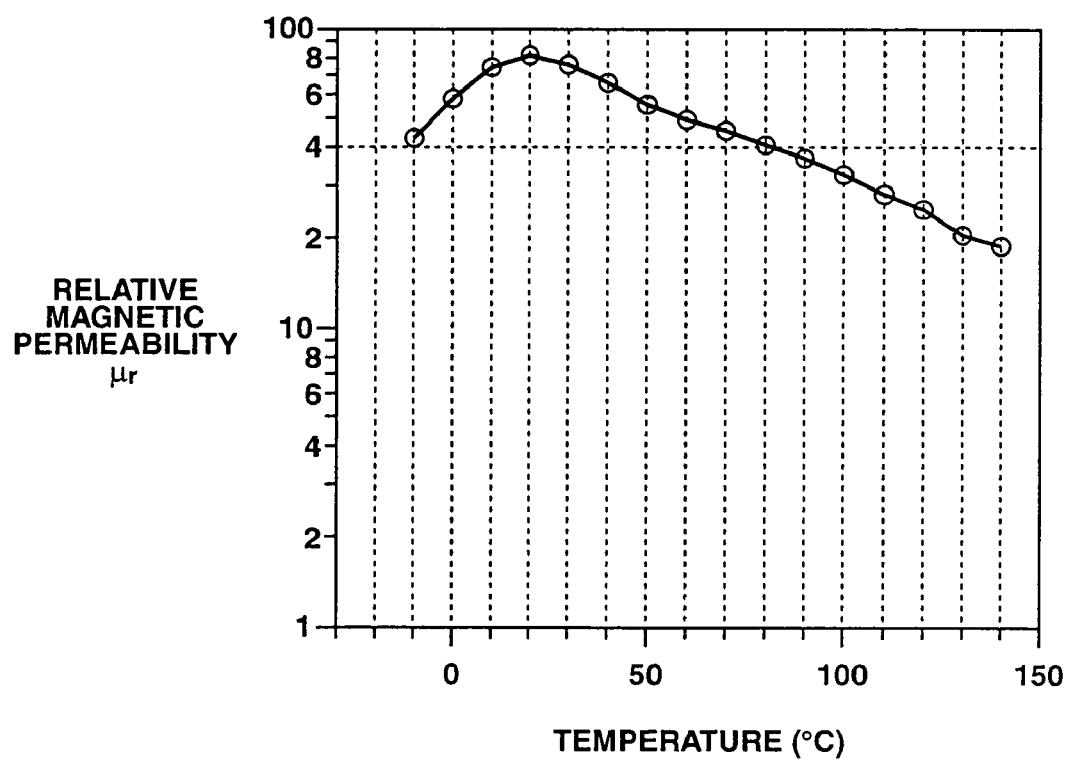
FIG. 6 is a diagram showing the temperature dependence of the relative magnetic permeability $\mu_r$ of a PCB of Example 3.

In the manufactured PCB, the relative magnetic permeability $\mu_r$ was measured. The results thereof are shown in FIG. 6.

When the blocking temperature $T_b$ was located in the vicinity of 20° C. and the temperature was located within a range of −10 to 80° C., the relative magnetic permeability $\mu_r$ exhibited 40 or higher. Further, the relative dielectric constant $\in_r$ exhibited a value not larger than 5.

(3) Method for Forming Transmitting Line

Then, a microstrip line was formed by a vapor deposition method in the PCB including the $Fe_{50}CO_{50}$ nanoparticles that were obtained as described above (see FIG. 4B). When the characteristic impedance $Z_o$ of a transmitting line was evaluated, the characteristic impedance $Z_o$ of the transmitting line had a value four times or more as high as the characteristic impedance $Z_o$ in the PCB of the comparative example within a range of temperature of −10 to 80° C.

Accordingly, it was recognized from the formula (1) that the PCB of the Example 3 could transmit a signal with a lower loss.

Example 4

Using materials, a method for forming the PCB and a method for forming a transmitting line in the Example 4 will be described below.

(1) Using Materials
(i) Magnetic nanoparticles: Toluene dispersion solution of trioctyl phosphine coated Co nanoparticles synthesized by the alcohol reducing method was used. The average particle size of the Co nanoparticles was 7.0 nm. The standard deviation of the particle size distribution was 10% as large as the average particle size.
(ii) Insulator material: Silica glass was used.

(2) Method for Forming PCB and Transmitting Line

After ethanol was added to the toluene dispersion solution of the Co nanoparticles to separate the black precipitation of the Co nanoparticles in accordance with a centrifugal separation.

Then, the precipitation was mixed in the solution having water mixed with aminopropyl triethoxy silane. The solution was agitated and tetraethoxy silane was added to the solution to obtain the dispersion aqueous solution of $SiO_2$ coated Co nanoparticles. The thickness of the $SiO_2$ coating layer of the $SiO_2$ coated Co nanoparticles was about 3 nm.

Then, the obtained dispersion solution was maintained at about 100° C. under reduced pressure to evaporate water and obtain a black residual solid material.

Then, the black residual solid material was compression-molded and sintered at 500° C. under the atmosphere of nitrogen to manufacture the PCB.

Figure 4B:
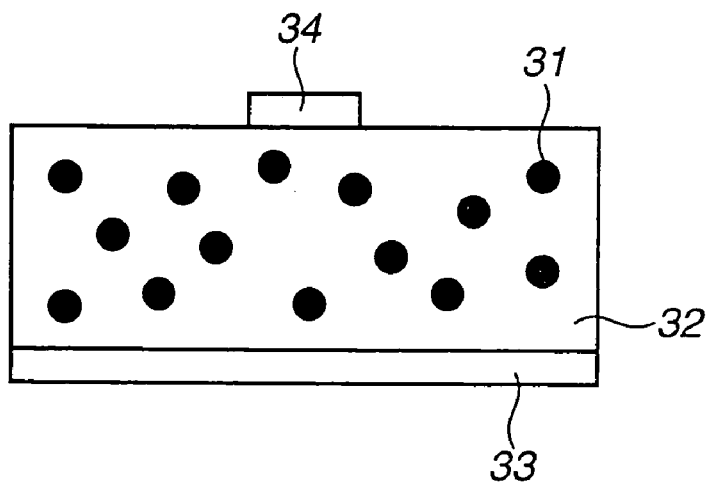

Then, a microstrip line was formed by a vapor deposition method in the manufactured PCB (see FIG. 4B). When the characteristic impedance $Z_o$ of a transmitting line was evaluated, it was recognized that the PCB of the Example 4 could transmit a signal with a lower loss.

Example 5

Using materials, a method for forming the PCB and a method for forming a transmitting line in the Example 5 will be described below.

(1) Using materials
(i) Magnetic nanoparticles: Toluene dispersion solution of oleic acid coated $Fe_3O_4$ magnetic nanoparticles synthesized by the alcohol reducing method was used. The average particle size of the $Fe_3O_4$ magnetic nanoparticles was 16 nm. The standard deviation of the particle size distribution was 19% as large as the average particle size.
(ii) Insulator material: Polystyrene was used.

(2) Method for Forming PCB and Transmitting Line

Polystyrene was mixed and dissolved in the toluene dispersion solution of the $Fe_3O_4$ magnetic nanoparticles. Here, the volume ratio of the $Fe_3O_4$ magnetic nanoparticles to polystyrene was set to 30:70.

Then, while the solution was agitated, the obtained dispersion solution was maintained at about 60° C. under reduced pressure to evaporate toluene and obtain a black residual solid material.

Then, the black residual solid material was compression-molded to manufacture the PCB.

Then, a microstrip line was formed by a vapor deposition method in the manufactured PCB (see FIG. 4B). When the characteristic impedance $Z_o$ of a transmitting line was evaluated, it was recognized that the PCB of the Example 5 could transmit a signal with a lower loss.

Example 6

Using materials, a method for forming the PCB and a method for forming a transmitting line in the Example 6 will be described below.

(1) Using materials
(i) Magnetic nanoparticles: Toluene dispersion solution of trioctyl phosphine coated Co nanoparticles synthesized by the alcohol reducing method was used. The average particle size of the Co nanoparticles was 7.0 nm. The standard deviation of the particle size distribution was 10% as large as the average particle size.
(ii) Insulator material: Polytetrafluoro ethylene was used.

(2) Method for Forming PCB and Transmitting Line

After perfluoro tetradecanoic acid (fluorocarbon surface active-agent) and perfluoro-2-butyl tetrahydrofuran (fluorocarbon solvent) were mixed in the toluene dispersion solution of the Co nanoparticles, the solution was violently agitated.

Then, the solution was moved to a separating funnel to remove toluene and obtain butyl-2-butyl tetrahydrofuran dispersion solution of perfluoro tetradecanoic acid coated Co nanoparticles.

Then, polytetrafluoro ethylene was mixed and dissolved in the obtained solution. Here, the volume ratio of the Co nanoparticles to polytetrafluoro ethylene was set to 30:70.

After that, while the solution was agitated, the obtained dispersion solution was maintained at about 100° C. under reduced pressure to evaporate butyl-2-butyl tetrahydrofuran and obtain a black residual solid material.

Then, the black residual solid material was compression-molded to manufacture the PCB.

Then, a microstrip line was formed by a vapor deposition method in the manufactured PCB (see FIG. 4B). When the characteristic impedance $Z_o$ of a transmitting line was evaluated, it was recognized that the PCB of the Example 6 could transmit a signal with a lower loss.

Example 7

Using materials, a method for forming the PCB and a method for forming a transmitting line in the Example 7 will be described below. (1) Using materials
(i) Magnetic nanoparticles: Hexane dispersion solution of oleic acid and oleyl amine coated FePt nanoparticles synthesized by a method described in Science, 2000, v. 287, p. 1989 by Sun et al. was used. The average particle size of the FePt nanoparticles was 2.9 nm. The standard deviation of the particle size distribution was 10% as large as the average particle size.
(ii) Insulator material: Silica glass was used.

(2) Method for Forming PCB and Transmitting Line

After ethanol was added to the hexane dispersion solution of the FePt nanoparticles, the black precipitation of the FePt nanoparticles was separated using a centrifugal separation.

Then, the precipitation was mixed in the solution having water mixed with aminopropyl triethoxy silane. The solution was agitated and tetraethoxy silane was added to the solution to obtain the dispersion aqueous solution of $SiO_2$ coated FePt nanoparticles. The thickness of the obtained $SiO_2$ coating layer of the $SiO_2$ coated FePt nanoparticles was about 1 nm.

Then, the obtained dispersion solution was maintained at about 100° C. under reduced pressure to evaporate water and obtain a black residual solid material.

Then, the black residual solid material was compression-molded and sintered at 800° C. under the atmosphere of nitrogen to manufacture the PCB.

Then, a microstrip line was formed by a vapor deposition method in the manufactured PCB (see FIG. 4B). When the characteristic impedance $Z_o$ of a transmitting line was evaluated, it was recognized that the PCB of the Example 7 could transmit a signal with a lower loss.

Example 8

Using materials, a method for forming the PCB and a method for forming a transmitting line in the Example 8 will be described below.

(1) Using Materials
(i) Magnetic nanoparticles: Toluene dispersion solution of oleic acid coated Co nanoparticles synthesized by the alcohol reducing method was used. The average particle size of the Co nanoparticles was 7.0 nm. The standard deviation of the particle size distribution was 10% as large as the average particle size.
(ii) Insulator material: Alumina was used.

(2) Method for Forming PCB and Transmitting Line

After ethanol was added to the toluene dispersion solution of the Co nanoparticles, the black precipitation of the Co nanoparticles was separated using a centrifugal separation.

Then, the precipitation was mixed in the solution having water mixed with aminopropyl triethoxy silane. The solution was agitated and tetrapropoxy aluminum was added to the solution to obtain the dispersion aqueous solution of alumina coated Co nanoparticles. The thickness of the obtained alumina coating layer of the alumina coated Co nanoparticles was about 3 nm.

Then, the obtained dispersion solution was maintained at about 100° C. under reduced pressure to evaporate water and obtain a black residual solid material.

Then, the black residual solid material was compression-molded and sintered at 500° C. under the atmosphere of nitrogen to manufacture the PCB.

Then, a microstrip line was formed by a vapor deposition method in the manufactured PCB (see FIG. 4B). When the characteristic impedance $Z_o$ of a transmitting line was evaluated, it was recognized that the PCB of the Example 8 could transmit a signal with a lower loss.

While the invention has been described in accordance with certain preferred embodiments thereof illustrated in the accompanying drawings and described in the above description in detail, it should be understood by those ordinarily skilled in the art that the invention is not limited to the embodiments, but various modifications, alternative constructions or equivalents can be implemented without departing from the scope and spirit of the present invention as set forth and defined by the appended claims.

What is claimed is:
1. A printed circuit board comprising:
an insulator and
superparamagnetic nanoparticles dispersed in the insulator,
wherein,
the superparamagnetic nanoparticles have a blocking temperature at 80° C. or lower, a volume filling rate of the superparamagnetic nanoparticles is not less than 5% and not higher than 60%, and surfaces of the superparamagnetic nanoparticles are coated with an organic stabilizer.

2. The printed circuit board according to claim 1, wherein the superparamagnetic nanoparticles are made of a material selected from a group including elements Fe, Co, Ni, Mn, Sm, Nd, Tb, Al, Pd and Pt, intermetallic compounds of the elements, binary alloys of the elements, ternary alloys of the elements, or the elements, the intermetallic compounds, the binary alloys, the ternary alloys including, as additional elements, at least one of Si, N, Mo, V, W, Ti, B, C and P, Fe oxides, Fe oxides further including at least one of the elements except Fe, Mn—Zn ferrites, Ni—Zn ferrites, Mg—Zn ferrites, Mg—Mn ferrites and garnet.

3. The printed circuit board according to claim 2, wherein the superparamagnetic nanoparticles comprise Co and the superparamagnetic nanoparticles have an average particle size of not more than 8 nm.

4. The printed circuit board according to claim 2, wherein the superparamagnetic nanoparticles comprise Fe and the superparamagnetic nanoparticles have an average particle size of not more than 25 nm.

5. The printed circuit board according to claim 2, wherein the superparamagnetic nanoparticles comprise FePt and the superparamagnetic nanoparticles have an average particle size of not more than 4 nm.

6. The printed circuit board according to claim 2, wherein the superparamagnetic nanoparticles comprise $Fe_3O_4$ and the superparamagnetic nanoparticles have an average particle size of not more than 30 nm.

7. The printed circuit board according to claim 1, wherein the insulator is made of a polymer material, ceramic, glass or a composite material of them.

8. The printed circuit board according to claim 7, wherein the insulator is made of polytetrafluoro ethylene, tetrafluoro ethylene-hexafluoro ethylene copolymer, tetrafluoro ethylene-hexafluoro propylene copolymer, tetrafluoro ethylene-perfluoroalkyl vinyl ether copolymer, polyvinyl fluoride, polyvinylidene fluoride, polymethyl pentene, polyethylene, polypropylene, polybutadiene, polyamide imide, polyether sulfone, polyether ether ketone, polystyrene, polyester, polycarbonate, polyimide, polyphenylene oxide, an epoxy resin or a cyanate resin.

9. The printed circuit board according to claim 7, wherein the insulator is made of alumina ceramic, aluminum nitride ceramic, silicon nitride ceramic, boron nitride ceramic or a composite material of them.

10. The printed circuit board according to claim 7, wherein the insulator is made of silica glass, silicon mica glass, crystal glass, quartz glass, borosilicate glass or a composite material of them.

11. The printed circuit board according to claim 1, wherein the superparamagnetic nanoparticles have an average particle size and a particle size distribution, and the particle size distribution has a standard deviation of not higher than 30% of the average particle size.

12. The printed circuit board according to claim 11, wherein the the particle size distribution has a standard deviation of not higher than 20% of the average particle size.

13. The printed circuit board according to claim 12, wherein the the particle size distribution has a standard deviation of not higher than 10% of the average particle size.

14. A printed circuit board comprising:

an insulator and superparamagnetic nanoparticles dispersed in the insulator;

wherein the superparamagnetic nanoparticles have a blocking temperature at 80° C. or lower;

wherein a volume filling rate of the superparamagnetic nanoparticles is not less than 5% and not greater than 60%;

wherein surfaces of the superparamagnetic nanoparticles are coated with an organic stabilizer;

wherein the superparamagnetic nanoparticles have an average particle size and a particle size distribution, and the particle size distribution has a standard deviation of not higher than 30% of the average particle size;

wherein the printed circuit board has a relative magnetic permeability $\mu_r$ of 10 or higher within an operating temperature range of –10 to 80° C.; and wherein the insulator has a relative dielectric constant $\in_r$ of no greater than 5.

15. A printed circuit board comprising:

an insulator and superparamagnetic nanoparticles dispersed in the insulator, wherein, the superparamagnetic nanoparticles have a blocking temperature at 80° C. or lower;

a volume filling rate of the superparamagnetic nanoparticles is not less than 5% and not greater than 60%, and the superparamagnetic nanoparticles have an average particle size and a particle size distribution, and the particle size distribution has a standard deviation of not higher than 30% of the average particle size.

* * * * *